United States Patent

Takano et al.

[11] Patent Number: 5,871,583
[45] Date of Patent: Feb. 16, 1999

[54] APPARATUS FOR PRODUCING SILICON SINGLE CRYSTAL

[75] Inventors: Kiyotaka Takano, Annaka; Izumi Fusegawa, Fukushima-ken; Hirotoshi Yamagishi, Annaka, all of Japan

[73] Assignee: Shin-Etsu Handotai Co., Ltd., Tokyo, Japan

[21] Appl. No.: 773,351

[22] Filed: Dec. 26, 1996

Related U.S. Application Data

[63] Continuation of Ser. No. 552,164, Nov. 2, 1995, abandoned, which is a continuation of Ser. No. 293,214, Aug. 19, 1994, abandoned.

[30] Foreign Application Priority Data

Aug. 27, 1993 [JP] Japan ................................. 5-212524

[51] Int. Cl.[6] .................................................. C30B 35/00
[52] U.S. Cl. .................................... 117/217; 117/218
[58] Field of Search ............................... 117/13, 14, 200, 117/201, 208, 217, 218

[56] References Cited

U.S. PATENT DOCUMENTS

| | | | |
|---|---|---|---|
| 4,058,699 | 11/1977 | Van Vloten | 219/121 |
| 5,186,911 | 2/1993 | Min et al. | 117/900 |
| 5,248,378 | 9/1993 | Oda et al. | 117/217 |

FOREIGN PATENT DOCUMENTS

| | | |
|---|---|---|
| 0 504 837 A2 | 9/1992 | European Pat. Off. |
| 2-267195 | 10/1990 | Japan. |
| 5-70283 | 3/1993 | Japan. |
| 2 163 367 | 2/1986 | United Kingdom. |

OTHER PUBLICATIONS

Patent Abstracts of Japan, vol. 7, No. 118 (C–167) (1263) 21 May 1983 & JP–A–58 036 998 (Toshiba Ceramics K.K.) 4 Mar. 1983 *abstract*.

*Primary Examiner*—F. C. Garrett
*Attorney, Agent, or Firm*—Nikaido, Marmelstein, Murray & Oram LLP

[57] ABSTRACT

An apparatus for producing a silicon single crystal grown by the Czochralski method includes a main chamber having a round soulder interconnecting the upper end of a side wall and the lower end of a neck of the main chamber. The round shoulder has an inside surface so profiled as to form a portion of the periphery of an ellipse drawn about two foci which are composed of the upper end of a heater and a point of the longitudinal axis of a silicon single crystal being grown. The inside surface has a low emissivity. With the apparatus thus constructed, a silicon single crystal having a high dielectric breakdown strength of oxide film ($SiO_2$) can be produced in a stable manner with high yield and productivity.

5 Claims, 2 Drawing Sheets

APPARATUS FOR PRODUCING SILICON SINGLE CRYSTAL

This application is a continuation of application Ser. No. 08/552,164 filed Nov. 2, 1995, now abandoned, which is a continuation of prior application Ser. No. 08/293,214, filed on Aug. 19, 1994, now abandoned.

BACKGROUND OF THE INVENTION

1. Field of the Invention

The present invention relates to an apparatus for producing a silicon single crystal grown by the Czochralski method also known as pulling method.

2. Description of the Prior Art and Related Art

Conventionally, in the production of a silicon single crystal grown by the Czochralski method (hereinafter referred to as "CZ" method), a silicon single crystal producing apparatus such as shown here in FIG. 2 of the accompanying drawings is used. The apparatus includes a main chamber 6 composed of a side wall 6a and an upper wall 7 having at its central portion a neck 4. Hot melt parts, which are used to heat the raw material to melt the same and keep the raw material in the molten or liquid state, are disposed at the central portion of the main chamber 6. The hot melt parts are composed of a quartz crucible 12 protected by a graphite crucible 11, and a heater 16 and a thermal shield or insulator 18 that are disposed around the crucibles 11, 12. The apparatus further includes a gate valve 8 disposed above the neck 4 of the main chamber 6, a pull chamber (not shown) and a crystal lift device including a lift mechanism (neither shown) that are disposed above the gate valve 8. An exhaust port 19 is connected with a vacuum pump (not shown) for controlling the pressure of an inert gas within the main chamber 6 and discharging the inert gas from the main chamber 6.

In operation, in an inert gas atmosphere held under reduced pressure, a seed crystal 26 fixed to the front end of a pull shaft 24, such as a wire, is dipped into a silicon melt 14 in the quartz crucible 12 while the quartz crucible 12 is rotating about its own axis. The seed crystal 26 while being rotated is then pulled up from the silicon melt 14 so that a silicon single crystal 28 is produced.

The single crystal produced by the CZ method is used to fabricate silicon wafers (hereinafter referred to as "CZ wafers"). It has been known that the CZ wafers have a dielectric breakdown strength of oxide film ($SiO_2$) which is considerably lower than that of those wafers fabricated from a single crystal produced by the floating zone method (FZ method), or that of epitaxial wafers each composed of a thin silicon film epitaxially grown on a CZ wafer. However, due to various advantageous features, the CZ wafers are widely used as a material for fabricating semiconductor devices.

More particularly, in recent years, with the advance of high integration of semiconductor circuits and accompanying microminiaturization of devices, the thickness of a dielectric oxide film at the gate electrode of a MOS-LSI chip has been reduced. However, even in the case of a thin dielectric oxide film, high qualities, such as a high dielectric breakdown strength and a small leakage current during operation of a device, are required. The oxide-film dielectric strength can be deteriorated by, for example, a defect induced by a thermal history during the growth of a silicon single crystal. It has been known that the dielectric breakdown strength characteristic is improved when the crystal growth rate is slowed down to change the thermal history of a silicon single crystal (see, Japanese Patent Laid-open Publication No. 2-267195, for example). The known method, however, requires a slowing down of the crystal growth rate in order to obtain a silicon single crystal with a high dielectric breakdown strength (of oxide film). The productivity of the single crystal growth process is reduced correspondingly.

In order to overcome the foregoing problem of the prior art, the behavior of heat treatments toward the CZ wafers was investigated by the present inventors. Through the investigation, the present inventors found that the dielectric breakdown strength characteristic can be improved by a high-temperature heat treatment conducted at temperatures above 1150° C. Based on that founding, the present inventors proposed a method which is capable of stably producing a silicon single crystal with high productivity by heat-treating a growing single crystal rod at temperatures above 1150° C. for a certain period of time within a growing furnace, and an apparatus suitable for reducing the method into practice (see, Japanese Patent Laid-open Publication No. 5-70283).

Through a further investigation, the present inventors found the proposed apparatus not to be fully satisfactory in that due to the flat and highly emissive top wall of a main chamber such as shown in FIG. 2, the heat generated from a growing single crystal is mostly scattered and lost.

SUMMARY OF THE INVENTION

It is accordingly a general object of the present invention to overcome the problem associated with the prior apparatus.

A more specific object of the present invention is to provide a silicon single-crystal growth apparatus which is capable of producing a silicon single crystal having a high dielectric breakdown strength in a stable manner with high yield and productivity.

An apparatus of the invention for producing a silicon single crystal grown by the Czochralski method includes a main chamber having an annular side wall, a neck disposed concentrically above the side wall, and a shoulder connecting an upper end of the side wall and an lower end of the neck. A quartz crucible is disposed in the main chamber inside the side wall for holding therein a silicon melt, with a heater and a thermal shield disposed between the quartz crucible and the side wall. A crystal lift mechanism is disposed above the main chamber for pulling a single crystal up from the silicon melt held in the quartz crucible. The shoulder has an inside surface so profiled as to form a portion of the periphery of an ellipse drawn about two foci composed of a point on a longitudinal axis of the silicon single crystal being grown and an upper end of the heater. The inside surface of the shoulder has a low emissivity.

Preferably, the inside surface of the shoulder is a polished surface, a gold-plated surface or a silver-plated surface and has an emissivity not greater than 0.2. Assuming that the transmittance of the main chamber from its interior to exterior side is zero, we can consider the emissivity to be 1—reflectivity. This means that as the emissivity decreases, the reflectivity increases and more radiant heat coming from the heater and the silicon melt can be reflected and transmitted.

The present invention is characterized by the shape and configuration of an inside surface of a shoulder which connects the upper end of a side wall and the lower end of a neck of a main chamber. The inside surface of the shoulder is so profiled as to form a portion of the periphery of an ellipse drawn about two foci which are composed of a point on a longitudinal axis of a silicon single crystal being grown and an upper end of the heater. The shape and configuration of the ellipse are particularly important.

It is preferable that (a) the major axis of the ellipse inclines downwardly toward the side wall of that side which is in contact with the ellipse and forms together with a horizontal line an angle of 5 to 25 degrees, (b) the major axis of the ellipse has a length which is 1.2 to 1.5 times larger than the diameter of the quartz crucible, and (c) the length of the major axis of the ellipse and the length of a minor axis of the ellipse are in the ratio 1.1:1 to 1.5:1.

If the angle of inclination of the major axis of the ellipse is less than 5 degrees, that is, if the upper end of the heater is located above the growing silicon single crystal and the silicon melt, the temperature gradient in the longitudinal direction of the growing silicon single crystal is extremely small. This arrangement is particularly advantageous for a purpose of reducing defects of the single crystal but brings about a considerable reduction of the productivity of the single crystal growth process due to an extremely small crystal growth rate. The angle of inclination, if exceeding 25 degrees, fails to provide a desired temperature distribution because the upper end of the heater is located below the growing silicon single crystal and the silicon melt and, hence, a heat source for slow-cooling the single crystal is distant from the single crystal.

If the length of the major axis of the ellipse is less than 1.2 times the diameter of the quartz crucible, a sufficient clearance cannot be provided between the quartz crucible and the heater and between the heater and the thermal shield, increasing the possibility of occurring electric discharge or sparking. On the other hand, the length of the major axis, if exceeding 1.5 times the diameter of the quartz crucible, relatively reduces the diameter of the quartz crucible and thereby lowers the amount of charge of the raw material per one crystal growth run, bringing about a reduction of the yield and productivity of the single crystal growth process.

The ratio of major axis to minor axis length, if smaller than 1.1:1, fails to provide an efficient heat transfer between the foci of the ellipse. If the ratio of major axis to minor axis length exceeds 1.5:1, the height of the main chamber becomes small, making it impossible to provide a sufficient upward stroke of the quartz crucible to keep the silicon melt at a constant level.

In the case of the ellipse, an angle formed between a tangent at any point of the circumference and one of the foci and an angle formed between the same tangent and the other focus are always the same. Accordingly, when a heat source and an object to be heated are located at a pair of foci of an ellipse, respectively, the radiant heat generated from the heat source (one focus) is focused or concentrated on the object (the other focus). This particular heat transfer characteristic of the ellipse is used in a lamp heating system.

In the CZ growth furnace, the heat is transferred mainly by means of radiation. Accordingly, the above-mentioned heat transfer characteristic of the ellipse can be also applied to the CZ single crystal growth to which the present invention pertains. Taking this into consideration, the present inventor completed the present invention. Stated more specifically, the principle of the present invention is that a heater as a heat source and a silicon single crystal as an object to be heated are disposed at two foci of an ellipse, the shoulder of a main chamber has an inside surface whose cross-sectional shape forms a portion of the periphery of an ellipse drawn about the foci, and the inside surface of the shoulder has a low emissivity not exceeding 0.2. With this arrangement, a highly efficient heat transfer can be attained between the heater (heat source) and the silicon single crystal (object to be heated).

According to the apparatus of the present invention, a space extending above the silicon melt is thermally shielded to change the distribution of heat in that space for regulating the thermal history of a silicon single crystal being grown such that a silicon single crystal having an excellent oxide-film dielectric breakdown characteristic can be produced without lowering the crystal growth rate.

With the apparatus of the present invention, a portion or region of the growing silicon single crystal which has temperatures above 1150° C. reaches to a level 360 mm above the silicon melt, as against 280 mm as obtained in the prior art. With the thus extended high temperature region, the percent nondefective of the oxide-film breakdown test which is about 40% in the prior art can be increased to about 80%.

The above and other objects, features and advantages of the present invention will become manifest to those versed in the art upon making reference to the detailed description and the accompanying sheets of drawings in which a preferred structural embodiment incorporating the principle of the present invention is shown by way of illustrative example.

DETAILED DESCRIPTION OF THE INVENTION

Figure 1:
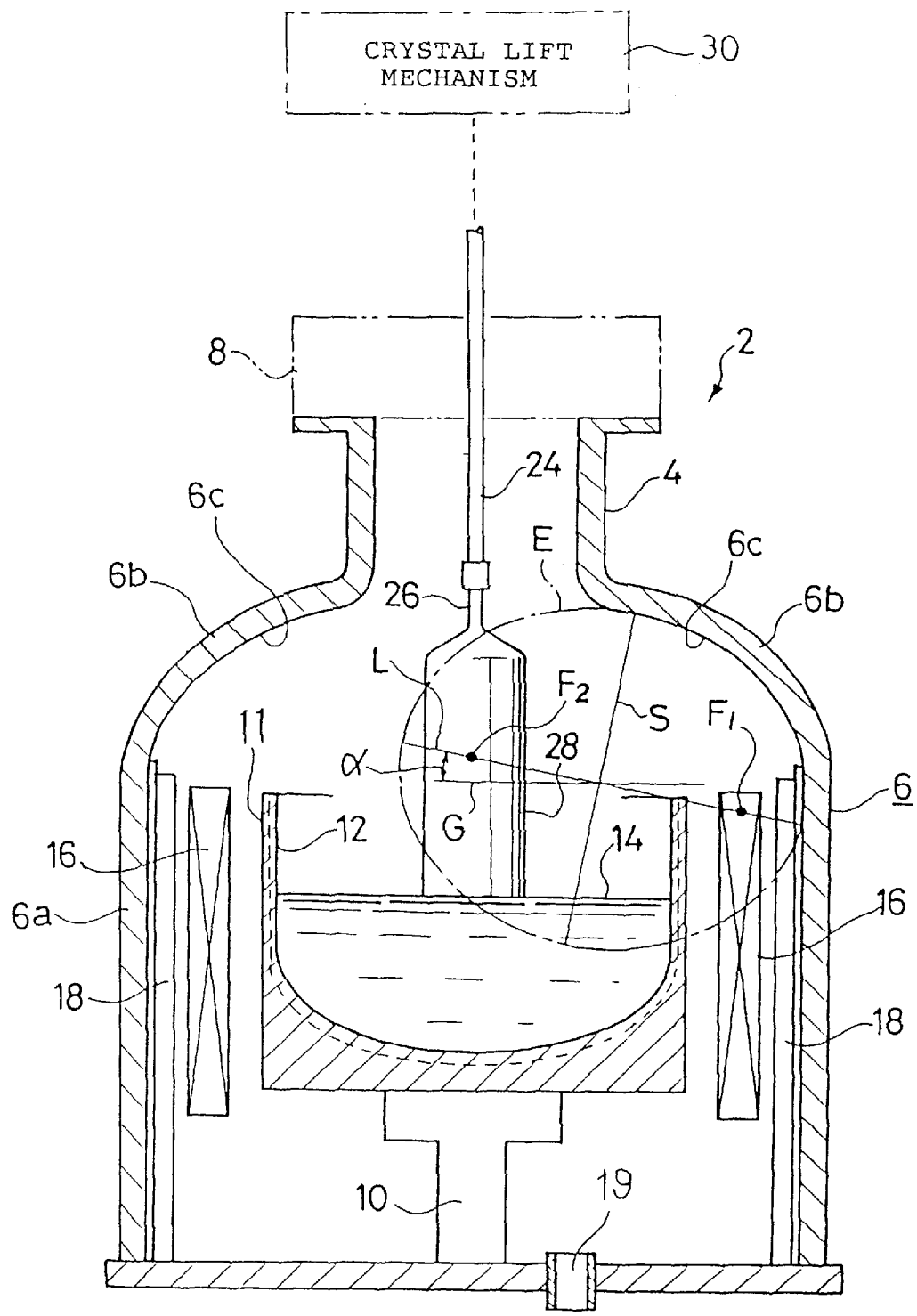
FIG. 1 is a diagrammatical cross-sectional view showing a silicon single-crystal growth apparatus according to an embodiment of the present invention.
Figure 2:
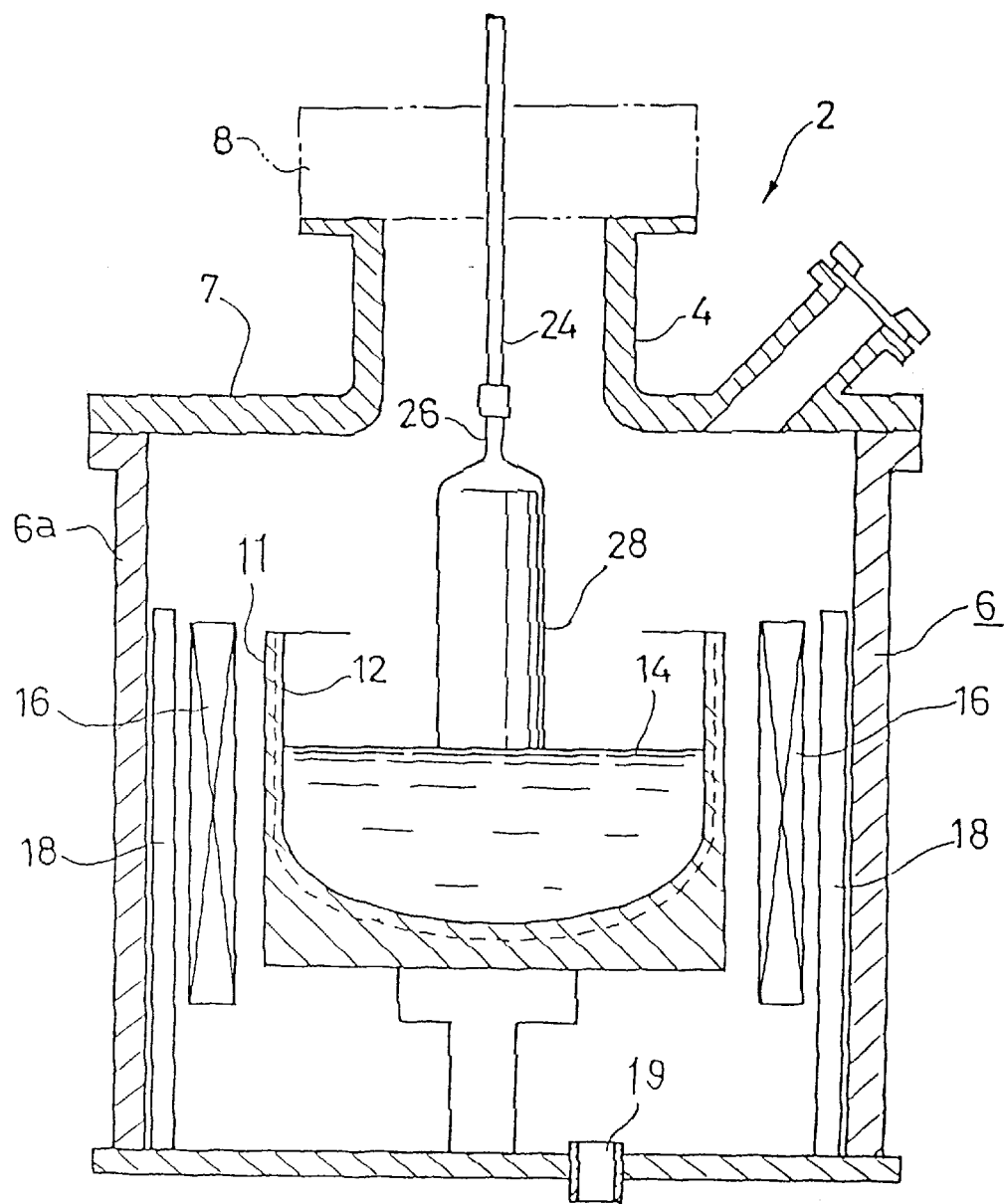
FIG. 2 is a diagrammatical cross-sectional view showing a conventional silicon single-crystal growth apparatus.

Referring now to the drawing and FIG. 1 in particular, there is shown an apparatus of the present invention for producing a silicon single crystal grown by the CZ method.

The apparatus, generally indicated by 2, includes a main chamber 6 composed of an upper neck 4 of a reduced diameter and an annular side wall 6a concentrical with the neck 4. The apparatus 2 further includes a crystal lift mechanism 30 and a pull chamber (not shown) that are disposed above the main chamber 6 with a gate valve 8 disposed between the main chamber 6 and a pull chamber. The crystal lift mechanism 30 and the pull chamber are of the construction known per se and, hence, a further description thereof can be omitted.

The main chamber 6 holds therein a quartz crucible 12 supported on a vertical shaft 10, with the quartz crucible 12 protected by a graphite crucible 11. The quartz crucible 12 holds therein a melt 14 of polycrystalline silicon. A heater 16 is disposed circumferentially around the quartz crucible 12 for heating the same. The heater 16 is encircled by a thermal shield or insulator 18. The main chamber 6 as a whole has a water jacket structure to avoid undue temperature rise.

A flexible pull shaft 24 such as a wire is vertically movably suspended from the crystal lift mechanism 30. The pull shaft 24 has a front end attached to a seed crystal 26. Under the control of the crystal lift mechanism 30, the seed crystal 26 is dipped into the silicon melt 14 and then lifted up from the silicon melt 16 by pulling the pull shaft 24 upwardly while rotating the seed crystal 26, so that a silicon single crystal 28 is produced.

The side wall 6a has an upper end connected to a lower end of the neck 4 by means of a shoulder 6b. The shoulder 6b is rounded and has an inside surface 6c which is so profiled as to form a portion of the periphery of an ellipse E drawn about a pair of fixed points or foci $F_1$, $F_2$ which are composed of a point on the longitudinal axis of a silicon single crystal 28 being grown and an upper end of the heater 16. Preferably, the inside surface 6c is polished or plated with gold or silver so as to lower its emissivity below 0.2.

The ellipse E is configurated such that the major axis L of the ellipse E slopes downwardly toward the side wall 6a of that side which is in contact with the ellipse E, the major axis L forms together with a horizontal line G an angle α of inclination of 5 to 25 degrees, the length of the major axis L is 1.2 to 1.5 times the diameter of the quartz crucible 12, and the ratio of major axis L to minor axis S length is 1.1:1 to 1.5:1.

The angle α of inclination, if less than 5 degrees, means that the position of the upper end of the heater 16 is displaced upwardly relative to the growing silicon single crystal 28 and the silicon melt 14. In this case, the temperature gradient in the longitudinal direction of the growing silicon single crystal 28 is extremely small. This is advantageous for a purpose of reducing the crystal defects, however, the crystal growth rate is considerably slowed down with the result that the productivity of the single crystal growth process is lowered correspondingly.

The angle α of inclination, if exceeding 25 degrees, means that the position of the upper end of the heater 16 is displaced downwardly relative to the growing silicon single crystal 28 and the silicon melt 14. In this instance, a heat source for slow-cooling the single crystal is located distantly and, hence, a desired temperature distribution cannot be obtained.

The length of the major axis L of the ellipse E, if less than 1.2 times the diameter of the quartz crucible 12, fails to provide a sufficient clearance between the quartz crucible 12 and the heater 15 and between the heater 15 and the thermal shield 18, increasing the possibility of occurring the electric discharge or sparking. Conversely, the length of the major axis L, if exceeding 1.5 times the diameter of the quartz crucible 12, fails to provide a sufficient crucible diameter and hence lowers the amount of charge of the raw material per unit crystal growth. As a result, the yield and productivity of the single crystal growth process are reduced.

The ratio of major axis L to minor axis S length, if smaller than 1.1:1, fails to provide an efficient heat transfer between the foci $F_1$ and $F_2$ of the ellipse. If the ratio of major axis L to minor axis S length exceeds 1.5:1, the height of the main chamber 6 per se becomes smaller than as required for providing a sufficient upward stroke of the quartz crucible 12 to keep the silicon melt 14 at a constant level.

In FIG. 1, numeral 19 denotes an exhaust port which is connected with a vacuum pump (not shown) for controlling the pressure of an inert gas within the main chamber 6 and discharging the inert gas from the main chamber 6.

With the construction described above, the radiant heat from the heater 16 can be efficiently directed to the silicon single crystal 28 being grown. A region or portion of the growing silicon single crystal which has temperatures above 1150° C. reaches to a level 360 mm above the silicon melt 14 which is 80 mm longer than the level (280 mm) obtained in the prior apparatus. With this extended high temperature region, the percent nondefective of the oxide-film breakdown test which is about 40% in the prior art is increased to about 80%.

As described above, the apparatus according to the present invention is able to produce a silicon single crystal of a high dielectric breakdown strength in a stable manner with high yield and productivity.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for producing a silicon single crystal grown by the Czochralski method, comprising:

a main chamber having an annular side wall, a neck disposed concentrically above said side wall, and a shoulder connecting an upper end of said side wall and a lower end of said neck;

a quartz crucible disposed in said main chamber inside said side wall for holding therein a silicon melt, with a heater and a thermal shield disposed between said quartz crucible and said side wall; and a crystal lift mechanism disposed above said main chamber for pulling a single crystal up from the silicon melt held in said quartz crucible along a silicon single crystal growth region, wherein said shoulder has an inside surface profiled as a portion of an ellipse drawn about two fixed foci wherein one of said foci is disposed on a longitudinal axis of a silicon single crystal growth region and the second of said foci is disposed at an upper end of said heater, wherein said ellipse has a major and minor axis and its major axis inclined downwardly toward said side wall of that side which is in contact with said ellipse, said major axis forms together with a horizontal line an angle of 5 to 25 degrees, said major axis has a length which is 1.2 to 1.5 times larger than a diameter of said quartz crucible, the length of said major axis of said ellipse and the length of the minor axis of said ellipse are in the ratio 1.1:1 to 1.5:1 and wherein said inside surface has a low emissivity of not greater than 0.2.

2. An apparatus according to claim 1, wherein said inside surface of said shoulder is a polished surface.

3. An apparatus according to claim 1, wherein said inside surface of said shoulder is plated with gold.

4. An apparatus according to claim 1, wherein said inside surface of said shoulder is plated with silver.

5. An apparatus according to claim 1, wherein said one of said foci disposed at a point on a longitudinal axis of the silicon single crystal growth region is disposed on a point on a longitudinal central axis of the silicon single crystal being grown.

\* \* \* \* \*